United States Patent [19]
Aoki et al.

[11] 4,084,986
[45] Apr. 18, 1978

[54] METHOD OF MANUFACTURING A SEMI-INSULATING SILICON LAYER

[75] Inventors: Teruaki Aoki, Tokyo; Takeshi Matsushita, Sagamihara; Tadayoshi Mifune, Yokohama; Hisao Hayashi, Atsugi, all of Japan

[73] Assignee: Sony Corporation, Tokyo, Japan

[21] Appl. No.: 678,061

[22] Filed: Apr. 19, 1976

[30] Foreign Application Priority Data

Apr. 21, 1975 Japan .................................. 50-48378

[51] Int. Cl.² .............................................. H01L 21/26
[52] U.S. Cl. ........................................ 148/1.5; 148/187; 357/52; 357/59; 357/91; 427/93; 427/94
[58] Field of Search ....................... 148/1.5; 357/52, 59, 357/91; 427/93, 94

[56] References Cited

U.S. PATENT DOCUMENTS

| | | | |
|---|---|---|---|
| 3,563,809 | 2/1971 | Wilson | 148/1.5 |
| 3,767,494 | 10/1973 | Muraoka et al. | 148/1.5 X |
| 3,897,274 | 7/1975 | Stehlin et al. | 357/91 X |
| 3,900,345 | 8/1975 | Lesk | 148/1.5 |
| 4,014,037 | 3/1977 | Matsushita et al. | 357/52 |

*Primary Examiner*—G. Ozaki
*Attorney, Agent, or Firm*—Hill, Gross, Simpson, Van Santen, Steadman, Chiara & Simpson

[57] ABSTRACT

An oxygen or nitrogen ion beam is implanted into a polycrystalline silicon or in an amorphous silicon layer, or a single crystal device body or layer, on a semiconductor substrate to an extent sufficient to convert the polycrystalline silicon layer, the amorphous layer or the single crystal device body or layer into a semi-insulating layer having a resistivity of $10^7$ to $10^{11}$ ohm-cm, which has improved passivation property.

18 Claims, 23 Drawing Figures

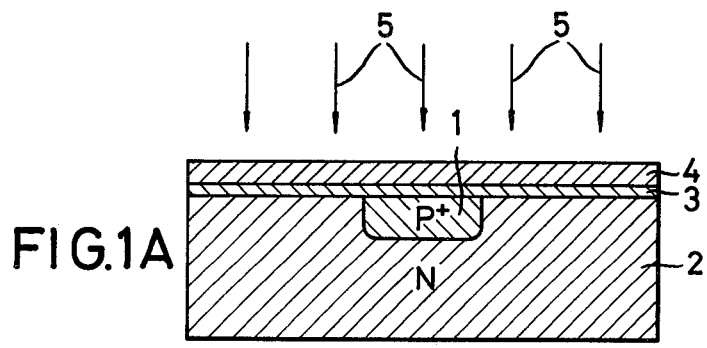
FIG. 1A
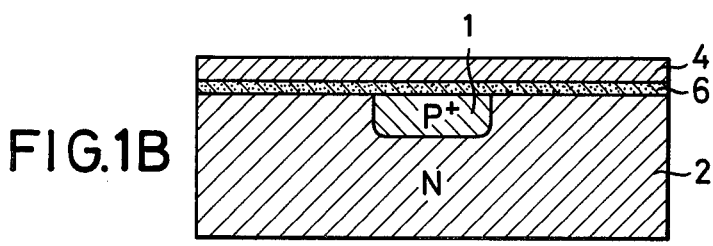
FIG. 1B
FIG. 2
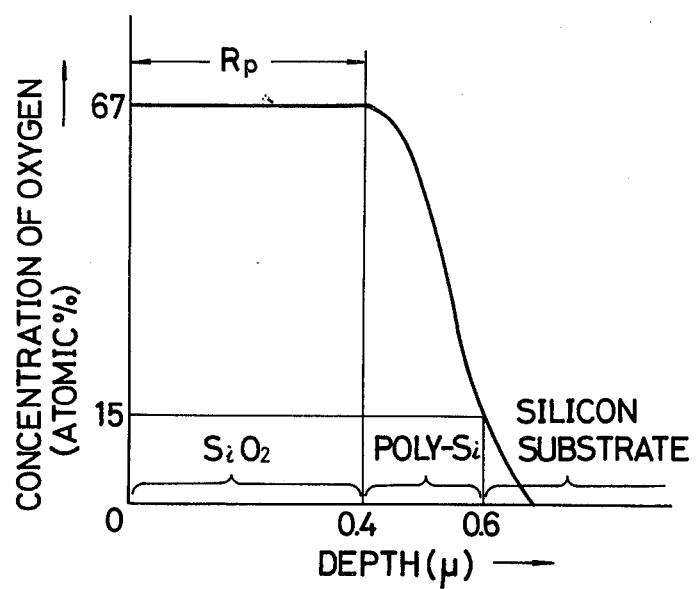

METHOD OF MANUFACTURING A SEMI-INSULATING SILICON LAYER

BACKGROUND OF THE INVENTION

This invention relates to a semiconductor device and to a method of manufacturing a semi-insulating layer therefor, and in particular, relates to semiconductor devices such as diodes, transistors or resistors which has one or more surface passivating layers, and to a method of manufacturing the same.

Conventional passivating layers include a $SiO_2$ layer, a glass layer with phosphorus, and a $Si_3N_4$ layer. In the case of $SiO_2$ layer, electric charges are induced at a surface of a semiconductor substrate by electric charges in the $SiO_2$ layer, which are fixed by the polarization in a molding resin, and it deteriorates the breakdown voltage and the reliability influenced by an external electric field. The above passivating layers have a bad water-resisting property, where the leakage current varies according to humidity conditions.

A pure polycrystalline silicon layer was also proposed for passivation, but it has a large leakage current and a small DC current gain $h_{FE}$, while it has a high breakdown voltage.

Matsushita et al applications, Ser. Nos. 561,532 (now U.S. Pat. No. 4,014,037) and 624,889, filed on Mar. 24, 1975 and Oct. 22, 1975, respectively, and assigned to the same assignee as the present invention, disclose a polycrystalline silicon layer with oxygen atoms and/or nitrogen atoms for passivation, where the resistance of the polycrystalline silicon layer is semi-insulating in character, having a resistivity of approximately $10^7$ to $10^{11}$ ohm-cm, and the breakdown voltage and the reliability from resistance to water are improved. This layer was provided not only for passivation, but also for the formation of a resistor or the like.

This polycrystalline silicon layer is uniformly formed by a chemical vapor deposition, in which silicon is deposited by a thermal decomposition of $SiH_4$ and oxygen or nitrogen is doped in silicon by a decomposition of nitrogen oxide ($N_2O$, etc.) or $NH_3$, respectively. This method is suitable for a uniform passivating layer, but it is difficult to control the gas flow rate and temperature to determine the oxygen or nitrogen concentration, to form a layer selectively or to vary the concentration profile laterally.

SUMMARY OF THE INVENTION

The object of this invention is to provide a novel semiconductor device and an improved method of manufacturing a polycrystalline silicon, an amorphous silicon, and/or a single crystal silicon device body or layer with oxygen and/or nitrogen. Oxygen and/or nitrogen is ion implanted into a silicon layer, which layer is converted into a semi-insulating layer. This enables the control of oxygen or nitrogen concentration precisely and easily, and to vary it laterally or vertically and to form the silicon layer selectively. By implanting the oxygen and/or nitrogen by an ion beam, different regions of a single layer may have different concentrations of oxygen and/or nitrogen.

The concentration of oxygen implanted into silicon is 2 to 45 atomic percent, but is preferably 15 to 35 atomic percent, to have a good passivation. There is observed a leakage current if oxygen is much less, and undesirable results such as those associated with $SiO_2$ result, if oxygen is much more. The nitrogen concentration is more than 10 atomic percent. The resistivity and water-protecting property is deteriorated if nitrogen is much less.

Where the layer is a polycrystalline, it is formed to have a grain size of 1000 A or less, and preferably a grain size of 100 to 200 A.

BRIEF DESCRIPTION OF THE DRAWINGS

FIGS. 1A and 1B show a first embodiment of the present invention;

FIG. 2 shows the oxygen concentration of a polycrystalline silicon layer;

DESCRIPTION OF THE PREFERRED EMBODIMENTS

Figure 3A:
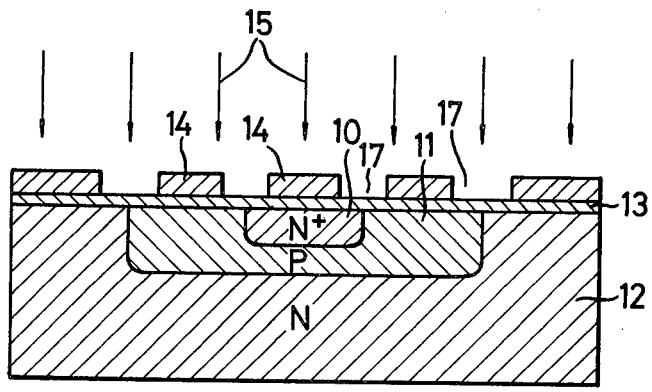
FIGS. 3A to 3C show a second embodiment of the present invention.

FIG. 1 shows a first embodiment of this invention applied to a diode. A P+ type region 1 is diffused in an N type silicon substrate 2. A pure polycrystalline silicon layer 3 of $0.2\mu$ thickness and a $SiO_2$ layer 4 of $0.4\mu$ thickness are deposited on the substrate 2 (FIG. 1A). Polycrystalline silicon is deposited by $SiH_4$ and $SiO_2$ is deposited by $SiH_4$ and $O_2$.

Then an oxygen ion $O^+$ beam 5 is implanted on the substrate 2 by an energy of 200 KeV, which cause $O^+$ ions to be injected into the polycrystalline silicon layer 3 through the $SiO_2$ layer 4. Gauss distribution of the $O^+$ concentration is shown in FIG. 2.

Annealing the substrate, $O^+$ ions are activated and the polycrystalline silicon layer 3 is converted into a semi-insulating layer 6 having a resistivity of $10^7$ to $10^{11}$ ohm-cm. The $SiO_2$ layer 4 and the semi-insulating layer 6 is selectively opened by any well known etching technique, and a metal electrode is deposited (not shown).

As the thickness of the $SiO_2$ layer 4 is selected as a mean projected range $R_p$ of $O^+$ ions (i.e., $0.4\mu$), the oxygen concentration is maximum 67 atomic percent, which is that of $SiO_2$ at an interface between the $SiO_2$ layer 4 and the semi-insulating layer 6. It follows Gauss distribution in the semi-insulating layer 6, an it is about 15 atomic percent at an interface between the semi-insulating layer 6 and the substrate 2. The above value is obtained when the $O^+$ ion dosing is $3 \times 10^{17}$ cm$^{-2}$. Thus, varying the dosing from 3 to $7 \times 10^{17}$ cm$^{-2}$ the oxygen concentration at the bottom of the semi-insulating layer 6 is varied from 15 to 35 atomic percent. This is achieved by controlling the ion source current density. $R_p$ will be $0.7\mu$ if the $O^+$ energy is 400 KeV. The thickness of the $SiO_2$ layer is determined by the energy.

As the semi-insulating layer 6 has more than 15 atomic percent oxygen, it serves for good passivation. Further, as the oxygen concentration is low (i.e., resistivity is low) at the bottom of the layer and is high (resistivity is high) at the top of the layer, it relaxes the electric field around the surface of the semiconductor substrate. The $SiO_2$ layer 4 serves for insulation between electrodes and the substrate 2, and protects humidity and contaminating charges.

Figure 3B:
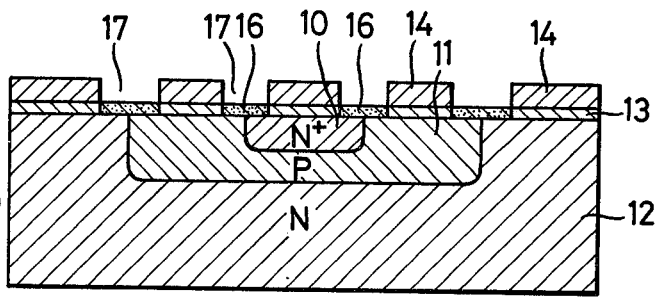
Figure 3C:
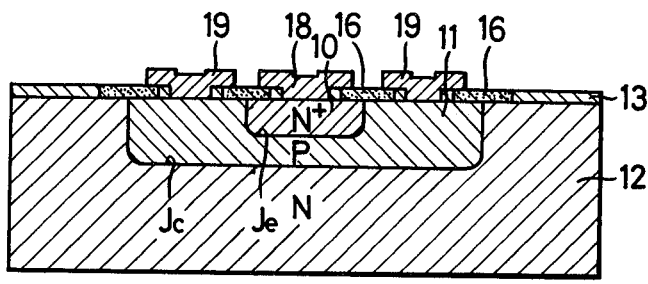

FIGS. 3A to 3C show a second embodiment of this invention applied to a bipolar transistor. A P type base region 11 and an N+ type emitter region 10 are diffused into an N type silicon substrate 12. A pure polycrystalline silicon layer 13 and a $SiO_2$ layer 14 are deposited on the substrate 12. Openings 17 in the $SiO_2$ layer 14 are made by etching above the surface ends of the PN junctions $J_3$ and $J_c$ (FIG. 3C).

Then the $O^+$ ion beam 15 is implanted into the polycrystalline silicon layer 13 through openings 17. The oxygen dosing of the polycrystalline silicon layer 13 at the bottom of the openings 17 is controlled so that the oxygen concentration is 15 to 35 atomic percent. The thickness of the $SiO_2$ layer 14 is selected to prevent substantial injection of $O^+$ ions into the polycrystalline silicon layer 13.

Then annealing the substrate, these portions of the polycrystalline silicon layer 13 are then coverted into a semi-insulating layer portions 16 (FIG. 3B).

The $SiO_2$ layer 14 is etched away and the polycrystalline silicon layer 13 is selectively etched by HF, $HNO_3$ and $CH_3COOH$, and emitter and base electrodes 18 and 19 are deposited (FIG. 3C).

The semi-insulating layer 16 stabilizes the passivation, increases $h_{FE}$ and reduces the leakage current more than the pure polycrystalline silicon does. The polycrystalline silicon layer 13 covers the collector region, but does not cover the collector-base junction. The semi-insulating layer 16 covers the collector-base junction, and also the emitter-base junction in FIG. 3.

Figure 4:
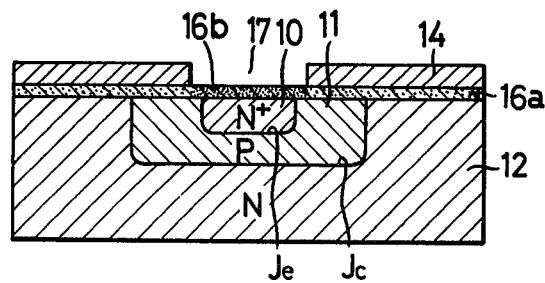
FIG. 4 shows a third embodiment of the present invention.

FIG. 4 shows a third embodiment of this invention applied to a bipolar transistor. In this embodiment, the $SiO_2$ layer 14 lies above a collector-base junction $J_c$. The thickness of the $SiO_2$ layer 14 and the energy of the $O^+$ ion beam are the same as the first embodiment.

A semi-insulating layer 16a under the $SiO_2$ layer 14 has 15 to 35 atomic percent oxygen, and an exposed semi-insulating layer 16b has 50 to 67 atomic percent oxygen. This device has higher $h_{FE}$ than the second embodiment, because of a smaller leakage current. The oxygen concentration can be selectively varied by selecting the pattern of the $SiO_2$ layer.

Figure 5A:
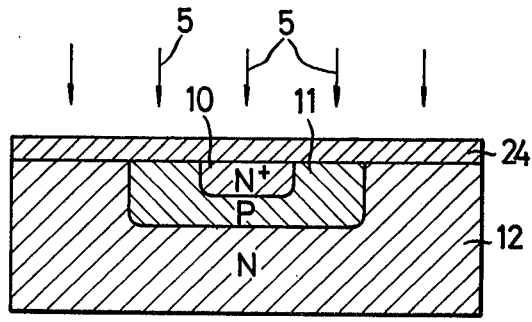
FIGS. 5A to 5C show a fourth embodiment of the present invention.
Figure 5B:
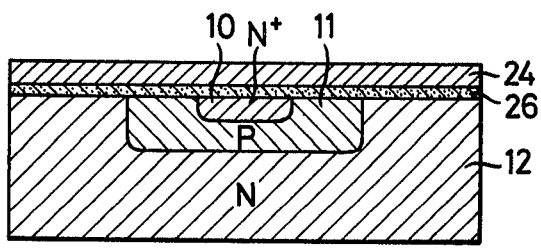
Figure 5C:
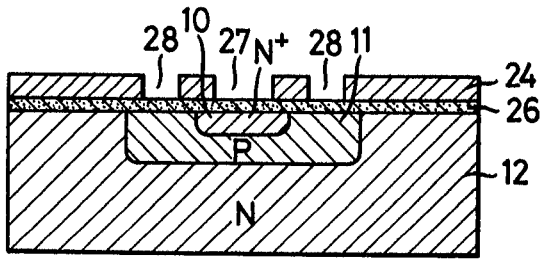

FIGS. 5A to 5C show a fourth embodiment of this invention applied to a bipolar transistor. This has a $SiO_2$ layer 24 of 0.4μ thickness. The $O^+$ ion beam 5 of 200 to 400 KeV energy was implanted into the substrate 12 through the $SiO_2$ layer 24 (FIG. 5A). Windows 27 and 28 are formed through a silicon dioxide layer 24 to expose the oxygen doped polycrystalline silicon layer 26 at the base of the windows. Annealing the substrate 12, the surface portion of the substrate is converted into a semi-insulating layer 26 having 0.2μ thickness and 15 to 35 atomic percent oxygen.

Figure 6:
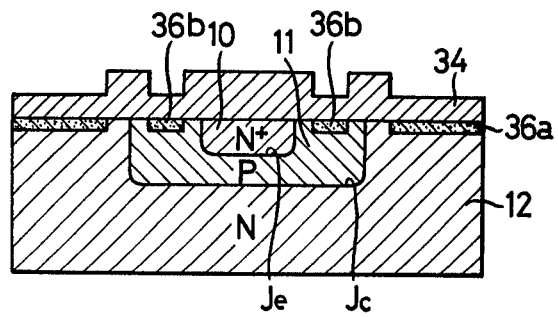
FIG. 6 shows a fifth embodiment of the present invention.

FIG. 6 shows a fifth embodiment of this invention applied to a bipolar transistor. The thickness of an $SiO_2$ layer 34 is 0.4μ on the base and collector regions, and that of the rest is thicker to prevent ions from penetrating therethrough.

Implanting the $O^+$ ion beam and annealing the device, semi-insulating layers 36a and 36b are selectively formed at the surface of the substrate 12. The semi-insulating layers 36a and 36b are spaced from the collector-base junction $J_c$ within a distance that a depletion layer reaches before a breakdown. This increases the breakdown voltage and reduces the leakage current.

Figure 7A:
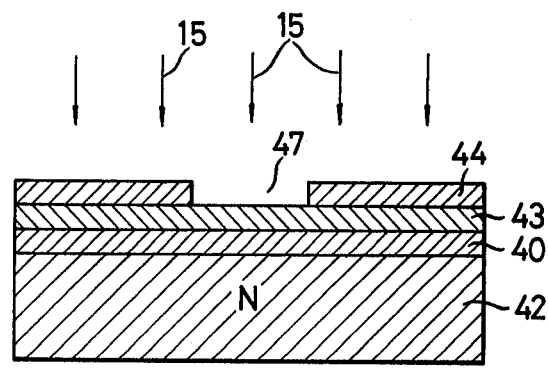
FIGS. 7A to 7C show a sixth embodiment of the present invention.
Figure 7B:
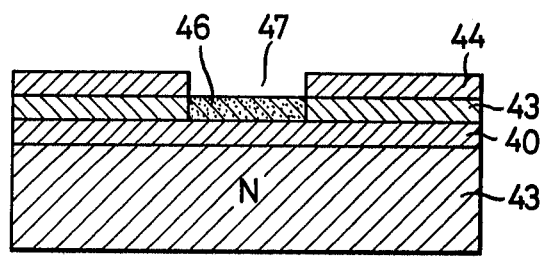
Figure 7C:
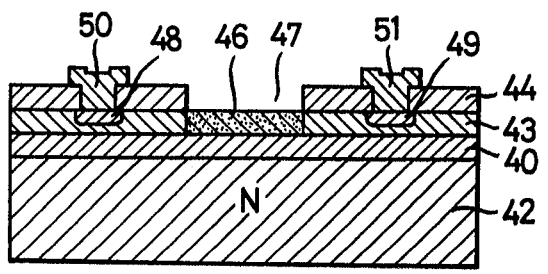

FIGS. 7A to 7C show a sixth embodiment of this invention applied to a resistor. A $SiO_2$ layer 40 is formed on an N type substrate 42 by thermal oxidation, and a pure polycrystalline silicon layer 43 and a $SiO_2$ layer 44 are deposited on it. An opening 47 is made in the $SiO_2$ layer 44, whose thickness is larger than $R_p$ to prevent ions from penetrating therethrough (FIG. 7A).

The $O^+$ ion beam 15 is implanted in that portion of the polycrystalline silicon layer 43 which lies below the opening 47. The oxygen concentration is, for example, 50 to 67 atomic percent. After annealing, the exposed polycrystalline silicon layer 43 is converted into a super high resistance layer 46 (FIG. 7B).

The $SiO_2$ layer 44 is selectively etched away and aluminum is contact-diffused to form regions 48 and 49 and electrodes 50 and 51. (FIG. 7C.). It is easy to make contacts to the pure polycrystalline silicon layer 43 because of high diffusion coefficient. The resistance value is controlled by the ion beam energy.

Figure 8A:
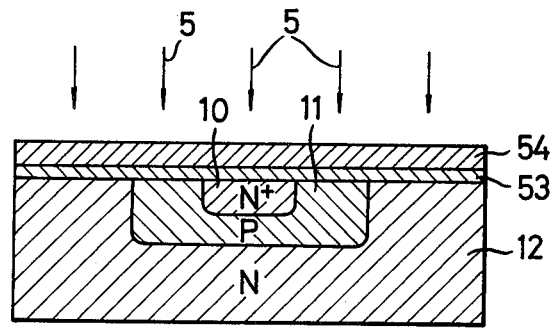
FIGS. 8A to 8F show a seventh embodiment of the present invention.

FIGS. 8A to 8F show a seventh embodiment of this invention applied to a bipolar transistor. A pure polycrystalline silicon layer 53 of 0.2μ thickness and a $SiO_2$ layer 54 of 0.4μ thickness are deposited on an N type silicon substrate 12. The $O^+$ ion beam is implanted into the polycrystalline silicon layer 53 through the $SiO_2$ layer 54 (FIG. 8A).

Figure 8B:
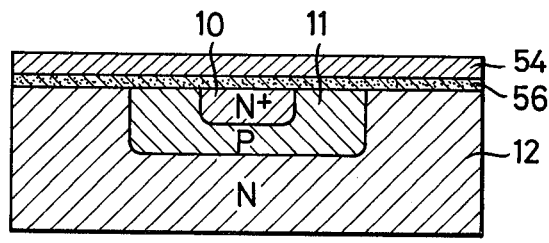

After annealing, the polycrystalline silicon layer 53 is converted into a semi-insulating layer 56 having 15 to 67 atomic percent oxygen (FIG. 8B). At 67 atomic percent oxygen, the layer 53 has almost the same insulating properties as silicon dioxide.

Figure 8C:
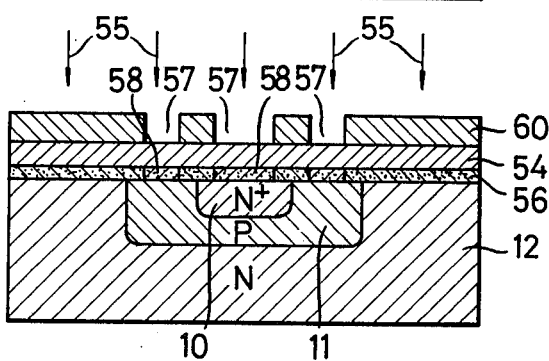

A $Si_3N_4$ layer 60 with openings 57 is deposited on the $SiO_2$ layer 54. A $N^+$ (nitrogen ion) beam is implanted into the polycrystalline silicon layer 56 through the openings 57 and the $SiO_2$ layer 54. Layers 58 under the openings 57 have oxygen and nitrogen, and the $SiO_2$ layer 54 under the openings 57 have nitrogen (FIG. 8C).

Figure 8D:
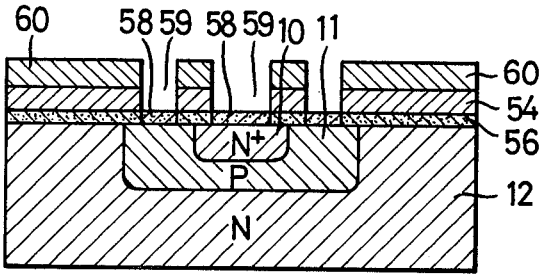

The $SiO_2$ layer 54 under the openings 57 is etched away by a masking of the $Si_3N_4$ layer 60 (FIG. 8D).

Figure 8E:
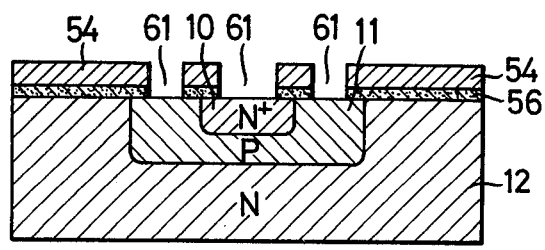

The $Si_3N_4$ layer 60 and the semi-insulating layer 58 under openings 59 are etched away to form openings 61 (FIG. 8E). The etching rate of the polycrystalline silicon is high when it has nitrogen. The semi-insulating layer 56 remains.

Figure 8F:
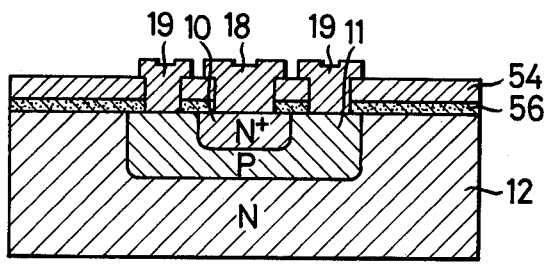

Emitter and base electrodes 18 and 19 are deposited (FIG. 8F).

The double semi-insulating layer structure has a good water-protecting property, as is described in U.S. Ser. No. 624,889.

There are some modifications of this invention. The oxygen or nitrogen concentration is varied according to the accelerating energy of $O^+$ ions or $N^+$ ions or the $SiO_2$ thickness. Ions can be introduced into the semiconductor substrate, as well as into the polycrystalline silicon. The conductivity can be converted. The oxygen or nitrogen concentration is laterally varied when a laterally movable mask is moved in implanting. In FIGS. 3A to 3C, if there is a thin $SiO_2$ layer in the opening 17 on the collector-base junction, there will be a semi-insulating layer with less oxygen under it.

Figure 9:
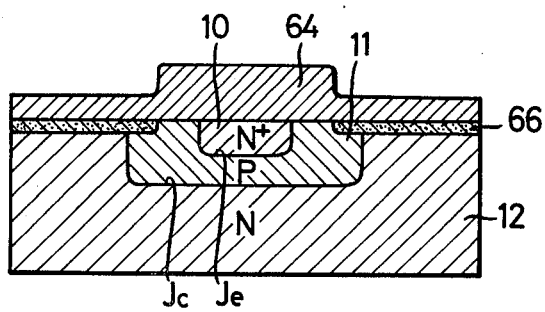
FIG. 9 shows a modification of the fifth embodiment of the invention.

FIG. 9 shows a modification of the fifth embodiment. A $SiO_2$ layer 64 has 0.4μ thickness on the collector and the collector-base junction $J_c$, and is thicker over the rest. A surface portion of the substrate is converted into a semi-insulating layer 66.

Figure 10A:
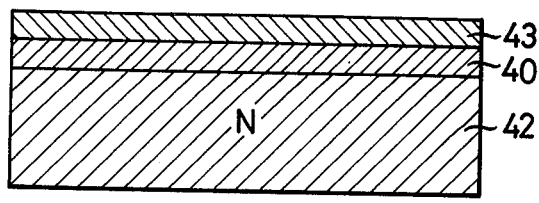
FIGS. 10A and 10B show a modification of the sixth embodiment of the invention.
Figure 10B:
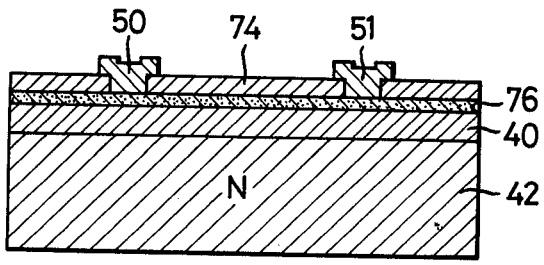

FIGS. 10A and 10B show a modification of the sixth embodiment. An O+ ion beam is implanted into the polycrystalline silicon layer 43 without the SiO₂ layer on it (FIG. 10A). It is converted into a SiO₂ upper layer 74 and a semi-insulating lower layer 76 (FIG. 10B).

In FIGS. 8A to 8F, oxygen ions can be selectively implanted after nitrogen ions have been implanted into semi-insulating layer.

It will be apparent to those skilled in the art that many modifications and variations may be effected without departing from the spirit and scope of the novel concepts of the present invention.

We claim as our invention:

1. A method of manufacturing a semiconductor device which includes implanting one of a group consisting of oxygen and nitrogen in a silicon layer, the implantation being continued until said layer has been converted into a semi-insulating layer having a resistivity of $10^7$ to $10^{11}$ ohm-cm.

2. A method of manufacturing a semiconductor device having a surface requiring passivation, which includes taking a single crystal semiconductor body, forming a polycrystalline silicon layer on one surface of said body, forming an insulating layer on said polycrystalline silicon layer, subjecting the insulating layer to an oxygen ion beam by an energy sufficiently high as to cause O+ ions to be injected into the polycrystalline silicon layer, and annealing said body to convert said polycrystalline silicon layer into a semi-insulating layer having a resistivity of $10^7$ to $10^{11}$ ohm-cm, the amount of oxygen in said converted polycrystalline silicon layer adjacent the silicon semiconductor body being 15 to 35 atomic percent.

3. A method of manufacturing a semiconductor device as set forth in claim 2, in which said insulating layer is silicon dioxide, and in which said single crystal semiconductor body is silicon.

4. A method of manufacturing a semiconductor device as set forth in claim 3, in which said polycrystalline silicon layer is given a thickness of 0.2µ, and said insulating layer is given a thickness of 0.4µ.

5. A method of manufacturing a semiconductor device as set forth in claim 3, in which portions of said silicon dioxide layer are removed to expose portions of said semi-insulating layer and wherein said exposed portions of said semi-insulating layer has between 50 to 67 atomic percent of oxygen.

6. A method of manufacturing a semiconductor device as set forth in claim 2, in which the energy of said ion beam is between 200 KeV and 400 KeV.

7. A method of manufacturing a semiconductor device as set forth in claim 2, in which the energy of said ion beam is 400 KeV, and in which the thickness of said insulating layer is approximately equal to the mean projected range of the O+ ions.

8. A method of manufacturing a semiconductor device as set forth in claim 2, in which the amount of oxygen in said converted polycrystalline silicon layer is between 2 and 45 atomic percent.

9. A method of manufacturing a semiconductor device as set forth in claim 2, in which the oxygen concentration is relatively low at the bottom of the polycrystalline silicon layer and is relatively high at the top of the polycrystalline silicon layer.

10. A method of manufacturing a semiconductor device which includes taking a semiconductor substrate of one conductivity type, diffusing at least one region in said substrate of the opposite conductivity type with at least one PN junction rising to one major surface of said substrate, forming a polycrystalline silicon layer on said one major surface, which covers the surface end of at least one PN junction, covering at least the portion of said polycrystalline silicon layer which lies above said surface end of at least one PN junction with an insulating layer, subjecting the insulating layer to an oxygen ion beam with an energy sufficiently high as to cause oxygen ions to be injected into said polycrystalline silicon layer, and annealing said body to convert said polycrystalline silicon layer into a semi-insulating layer having a resistivity of $10^7$ to $10^{11}$ ohm-cm, the amount of oxygen in said converted polycrystalline silicon layer being 15 to 35 atomic percent.

11. A method of manufacturing a junction type transistor having a substrate of one conductivity type forming a collector region, a base region of the opposite conductivity type formed in a planar surface of said collector region with said collector region surrounding said base region, an emitter region of said first conductivity type formed in the planar surface of said base region, there being a PN junction between said base and collector which rises to said planar surface and a PN junction between said emitter and said base which rises to said planar surface, forming a polycrystalline silicon layer on said planar surface of said substrate, forming an insulating layer on said polycrystalline silicon layer, subjecting said substrate to an oxygen ion beam which has an energy sufficiently high to cause oxygen ions to be injected into said polycrystalline silicon layer, and annealing said substrate to convert said polycrystalline silicon layer into a semi-insulating layer having a resistivity of $10^7$ to $10^{11}$ ohm-cm, the amount of oxygen in said converted polycrystalline silicon layer being 15 to 35 atomic percent near the substrate-polycrystalline interface and approximately 67 atomic percent near the polycrystalline-insulating layer interface.

12. A method of manufacturing a semiconductor device having a surface requiring passivation, which includes taking a single crystal semiconductor body, forming a polycrystalline silicon layer on one surface of said body, forming an insulating layer on said polycrystalline silicon layer, subjecting the insulating layer to a nitrogen ion beam by an energy sufficiently high as to cause nitrogen ions to be injected into the polycrystalline silicon layer, and annealing said body to convert said polycrystalline silicon layer into a semi-insulating layer having a resistivity of $10^7$ to $10^{11}$ ohm-cm, the amount of nitrogen in said converted polycrystalline silicon layer being in excess of 10 atomic percent near its interface with said single crystal semiconductor body.

13. A method of manufacturing a junction type transistor having a substrate of one conductivity type forming a collector region, a base region of the opposite conductivity type formed in a planar surface of said collector region with said collector region surrounding said base region, an emitter region of said first conductivity type formed in the planar surface of said base region, there being a PN junction between said base and collector which rises to said planar surface and a PN junction between said emitter and said base which rises to said planar surface, forming a polycrystalline silicon layer on said planar surface of said substrate, forming an insulating layer on said polycrystalline silicon layer, whose thickness is sufficiently great as to prevent subsequent bombardment by an O+ ion beam from penetrating to said polycrystalline layer, etching openings in said insulating layer above the surface ends of said PN junctions, subjecting the said openings to an O+ ion beam to cause O+ ions to be injected into the portions of said polycrystalline layer below said openings, and annealing said substrate to convert said polycrystalline layer portions below said openings into semi-insulating layer portions having a resistivity of $10^7$ to $10^{11}$ ohm-cm.

14. A method of manufacturing a junction type semiconductor device which includes a substrate of one conductivity type, diffusing a base region of the opposite conductivity type in an upper planar surface of said substrate, diffusing an emitter region of said first conductivity type in the upper planar surface of said base region, forming a polycrystalline layer on said planar surface of said substrate covering the surface ends of said PN junctions, forming an insulating layer on said polycrystalline layer, etching an opening through said insulating layer above said emitter region and above said emitter-base junction, and subjecting the said insulating layer and its opening to an oxygen ion beam of sufficient intensity to cause the oxygen injection of the polycrystalline layer below said opening to be raised to 50 to 67 atomic percent and to raise the oxygen content of said polycrystalline layer below said insulating layer to 15 to 35 atomic percent.

15. A method of manufacturing a junction type semiconductor device which includes a substrate of one conductivity type, diffusing a base region of the opposite conductivity type in an upper planar surface of said substrate, diffusing an emitter region of said first conductivity type in the upper planar surface of said base region, forming a polycrystalline layer on said planar surface of said substrate covering the surface ends of said PN junctions, forming an insulating layer on said polycrystalline layer, etching openings through said insulating layer above said emitter region and above said base region, but not above said emitter-base junction nor above said base-collector junction, and subjecting the said insulating layer and its openings to an oxygen ion beam of sufficient intensity to cause the oxygen injection of the polycrystalline layer below said openings to be raised to 50 to 67 atomic percent and to raise the oxygen content of said polycrystalline layer below said insulating layer to 15 to 35 atomic percent.

16. A method of manufacturing a semiconductor device which includes taking a semiconductor substrate of one conductivity type, diffusing a base region of the opposite conductivity type in one planar surface of said substrate, diffusing an emitter region of said first conductivity type in the planar surface of said base region, covering said planar surface with an insulating layer having a greater thickness above the surface ends of the base-collector junction and the emitter-base junction, subjecting said insulating layer to an oxygen ion beam having sufficient energy to convert the portions of said substrate below the under surface of said insulating layer into a relatively thin polycrystalline layer, the thicker portion of said insulating layer being of such thickness that the ion beam does not penetrate to the surface ends of said junctions, and annealing said substrate.

17. The method of manufacturing a resistor which includes forming a silicon dioxide layer by thermal oxidation on a silicon substrate, forming a pure polycrystalline silicon layer by epitaxial growth on said silicon dioxide layer, forming a second silicon dioxide layer by epitaxial growth on said pure polycrystalline silicon layer, etching an opening through said second silicon dioxide layer, implanting an oxygen ion beam in the portion of the polycrystalline silicon layer lying below said opening, the oxygen concentration in said portion below said opening being 50 to 67 atomic percent, annealing the exposed polycrystalline silicon layer to convert said portion into a super high resistance layer, forming two additional openings through said second silicon dioxide layer on opposite sides of said first opening, and diffusing aluminum contacts through said second openings into contact with said polycrystalline layer.

18. A method of manufacturing a bipolar transistor which includes taking a silicon substrate of one conductivity type which provides a collector, diffusing into a planar surface thereof a base region of the opposite conductivity type, diffusing an emitter region of the first conductivity type into a planar surface of said base region, forming a pure polycrystalline silicon layer on said substrate having a thickness of $0.2\mu$, forming a silicon dioxide layer on said polycrystalline layer having a thickness of $0.4\mu$, implanting oxygen ions in the polycrystalline layer through the silicon dioxide layer, annealing the polycrystalline layer to convert it into a semi-insulating layer having 15 to 67 atomic percent oxygen, depositing a $Si_3N_4$ layer on said silicon dioxide layer with openings therein above said emitter region and above said base region, implanting a nitrogen ion beam into said polycrystalline layer through said openings to cause the portions of said polycrystalline layer below said openings to have oxygen and nitrogen and the portions of said silicon dioxide layer below said openings to have nitrogen, etching away the portion of said silicon dioxide layer below said openings, and forming emitter and base electrodes by deposition in said openings.

* * * * *